United States Patent
Chun et al.

(10) Patent No.: US 9,570,364 B2
(45) Date of Patent: Feb. 14, 2017

(54) METHOD OF DETECTING FOCUS SHIFT IN LITHOGRAPHY PROCESS, METHOD OF ANALYZING ERROR OF TRANSFERRED PATTERN USING THE SAME AND METHOD OF MANUFACTURING SEMICONDUCTOR DEVICE USING THE METHODS

(71) Applicant: Samsung Electronics Co., Ltd., Suwon-si (KR)

(72) Inventors: Yong-Jin Chun, Daejeon (KR); Suk-Joo Lee, Yongin-si (KR); Byoung-Il Choi, Seongnam-sl (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/675,683

(22) Filed: Mar. 31, 2015

(65) Prior Publication Data
US 2016/0055288 A1    Feb. 25, 2016

(30) Foreign Application Priority Data
Aug. 19, 2014   (KR) .......................... 10-2014-0107742

(51) Int. Cl.
G01R 31/26 (2014.01)
H01L 21/66 (2006.01)
G03F 7/20 (2006.01)

(52) U.S. Cl.
CPC ............. *H01L 22/12* (2013.01); *G03F 7/706* (2013.01)

(58) Field of Classification Search
CPC ................... H01L 2924/0002; H01L 2924/00; H01L 21/76843; H01L 21/76877; H01L 29/665; H01L 21/76834; H01L 21/28052; H01L 21/28518; H01L 21/76856; H01L 2924/1305; H01L 2924/1306; H01L 29/6659
See application file for complete search history.

(56) References Cited

U.S. PATENT DOCUMENTS

| | | |
|---|---|---|
| 7,012,672 B2 | 3/2006 | Van Rhee et al. |
| 7,119,893 B2 | 10/2006 | Littau et al. |
| 7,412,676 B2 | 8/2008 | Cobb et al. |
| 7,532,307 B2 | 5/2009 | Van Der Schaar et al. |
| 7,642,019 B2 | 1/2010 | Kim |
| 7,656,512 B2 | 2/2010 | Mieher et al. |

(Continued)

FOREIGN PATENT DOCUMENTS

| | | |
|---|---|---|
| JP | 2007-184378 | 7/2007 |
| JP | 4408876 | 2/2010 |

(Continued)

*Primary Examiner* — Robert Bachner
(74) *Attorney, Agent, or Firm* — Muir Patent Law, PLLC

(57) ABSTRACT

A method of detecting focus shift in a lithography process, a method of analyzing an error of a transferred pattern using the same, and a method of manufacturing a semiconductor device using the methods are provided. The focus shift detecting method of a lithography process comprises generating a first contour band of a mask pattern between a first focus and a second focus, generating a second contour of the mask pattern between the first focus and a third focus, and determining whether focus shift of the mask pattern occurs using an intersection of the first contour band and the second contour band.

8 Claims, 13 Drawing Sheets

(56) References Cited

U.S. PATENT DOCUMENTS

| | | |
|---|---|---|
| 7,838,185 B2 | 11/2010 | Ide et al. |
| 7,852,477 B2 | 12/2010 | Miyashita |
| 7,855,037 B2 | 12/2010 | Kim |
| 7,948,616 B2 | 5/2011 | Miyashita |
| 8,040,497 B2 | 10/2011 | Werner et al. |
| 8,245,160 B2 | 8/2012 | Ye et al. |
| 8,537,334 B2 | 9/2013 | Matsumoto |
| 2006/0234137 A1 | 10/2006 | Kim |
| 2008/0192221 A1* | 8/2008 | Mieher ............... G03F 7/70641 355/55 |
| 2010/0162197 A1 | 6/2010 | Ye et al. |

FOREIGN PATENT DOCUMENTS

| | | |
|---|---|---|
| JP | 2010-152356 | 7/2010 |
| KR | 10-0643226 | 11/2006 |
| KR | 10-0714480 | 5/2007 |
| KR | 10-2008-0052397 | 6/2008 |
| KR | 10-0882973 | 2/2009 |
| KR | 10-2010-0014357 | 2/2010 |

* cited by examiner

Fig 9

| | P1 | P2 |
|---|---|---|
| bf±△f1 | O | X |
| bf±△f2 | X | X |
| bf±△f3 | X | X |
| bf±△f4 | X | X |

(△f1<△f2<△f3<△f4)
(O: focus shift, X:No focus shift)

Fig 10

| | P1 | P2 |
|---|---|---|
| Amount of focus shift | $\frac{\triangle f1}{2} \leq f.s. < \frac{\triangle f2}{2}$ | $f.s. < \frac{\triangle f1}{2}$ |

METHOD OF DETECTING FOCUS SHIFT IN LITHOGRAPHY PROCESS, METHOD OF ANALYZING ERROR OF TRANSFERRED PATTERN USING THE SAME AND METHOD OF MANUFACTURING SEMICONDUCTOR DEVICE USING THE METHODS

CROSS-REFERENCE TO RELATED APPLICATION

This application claims priority from Korean Patent Application No. 10-2014-0107742 filed on Aug. 19, 2014 in the Korean Intellectual Property Office, and all the benefits accruing therefrom under 35 U.S.C. 119, the contents of which in its entirety are herein incorporated by reference.

TECHNICAL FIELD

The present inventive concept relates to a method of detecting focus shift in a lithography process, a method of analyzing an error of a transferred pattern using the same, and a method of manufacturing a semiconductor device using the methods.

BACKGROUND

Lithography refers to a process which is used to manufacture semiconductor integrated circuit elements. A lithography process includes coating a semiconductor wafer so as to have a photosensitive layer and exposing the photosensitive layer by transmitting an actinic light source onto a photomask having an image of an integrated circuit.

The photomask which is used for the lithography process includes various mask patterns. In certain instances, individual mask patterns which are included in the photomask are configured, for example, by combination of various variables such as a shape, a line width, and an interval between patterns.

In the lithography process which forms a semiconductor integrated circuit element on a semiconductor substrate, even though a transferred pattern is formed on the photosensitive layer using an optical focus of an exposure apparatus, a focus shift may occur in one or more mask patterns which are included in the photomask.

SUMMARY

Aspects of present inventive concept have been developed in an effort to provide a focus shift detecting method which may predict focus shift for individual mask patterns which are used to implement a semiconductor integrated circuit element, before forming a transferred pattern by a lithography process.

Certain embodiments of the present inventive concept provide a focus shift detecting method which may predict a range of focus shift for the mask patterns which are used to implement a semiconductor integrated circuit element.

Certain embodiments of the present inventive concept provide a method of analyzing an error of a transferred pattern which may determine whether the error of the transferred pattern on the photosensitive layer is caused by a focus shift of the transferred pattern using the focus shift detecting method.

Technical objects of the present disclosure are not limited to the above-mentioned aspects, and other technical objects, which are not mentioned above, can be clearly understood by those skilled in the art from the following descriptions.

According to an aspect of the present inventive concept, there is provided a focus shift detecting method of a lithography process, the method comprising generating a first contour band of a mask pattern between a first focus and a second focus, generating a second contour band of the mask pattern between the first focus and a third focus, and determining whether focus shift of the mask pattern occurs using an intersection of the first contour band and the second contour band.

It may be determined whether the focus shift of the mask pattern occurs using whether there is the intersection.

It may be determined that the focus shift of the mask pattern occurs in the lithography process when the intersection is a null set.

A sum of the second focus and the third focus may be twice the first focus, and when the intersection is a null set, a focus shift amount of the mask pattern may be equal to or more than half an absolute value of a difference between the first focus and the second focus.

The focus shift of the mask pattern may be determined using an AND operation of the first contour band and the second contour band.

The first focus may be a best focus of an exposing apparatus which is used for the lithography process, the second focus may be a value obtained by subtracting a predetermined focus deviation from the first focus, and the third focus may be a value obtained by adding the predetermined focus deviation to the first focus.

The focus deviation may be twice the focus shift amount to be detected.

The generating of a first contour band may include generating a first contour of the mask pattern at the first focus, generating a second contour of the mask pattern at the second focus, and performing an XOR operation on the first contour and the second contour.

In the generating of a first contour, a shape of the mask pattern to be transferred onto a photosensitive layer may be simulated using an optical model.

The optical model may use a mask 3D model.

According to another aspect of the present inventive concept, there is provided a focus shift detecting method of a lithography process, the method comprising generating a first contour band of a mask pattern between a best focus and a first focus, generating a second contour band of the mask pattern between the best focus and a second focus, generating a third contour band of the mask pattern between the best focus and a third focus, generating a fourth contour band of the mask pattern between the best focus and a fourth focus, and determining a focus shift range of the mask pattern using a first intersection of the first contour band and the second contour band and a second intersection of the third contour band and the fourth contour band.

The best focus may be a focus of an exposing apparatus which is used for the lithography process, a median value of the first focus and the second focus and a median value of the third focus and the fourth focus are the best focuses, respectively, and a first focus deviation between the best focus and the first focus is less than a second focus deviation between the best focus and the third focus.

When the first intersection and the second intersection are a null set, a focus shift amount of the mask pattern may be equal to or more than half the second focus deviation.

When the first intersection is a null set and the second intersection is not a null set, the focus shift amount of the mask pattern may be equal to or more than half the first focus deviation and less than half the second focus deviation.

The generating of a first contour band may include generating a best contour of the mask pattern at the best focus, generating a first contour of the mask pattern at the first focus, and performing an XOR operation on the best contour and the first contour.

According to another aspect of the present disclosure, there is provided a method of manufacturing a semiconductor device, the method comprises providing a semiconductor substrate, forming a photosensitive layer on the semiconductor substrate, exposing a light pattern on the photosensitive layer using a photomask and an exposure apparatus, and developing the photosensitive layer to form photosensitive pattern, wherein a pattern of the photomask or a parameter of the exposure apparatus is adjusted using a focus shift detecting method, and the focus shift detecting method comprises generating a first contour band of a mask pattern between a first focus and a second focus, generating a second contour band of the mask pattern between the first focus and a third focus, and determining whether focus shift of the mask pattern occurs using an intersection of the first contour band and the second contour band.

It may be determined that the focus shift of the mask pattern occurs in the lithography process when the intersection is a null set.

The first focus may be a best focus of the exposure apparatus, the second focus may be a value obtained by subtracting a predetermined focus deviation from the first focus, and the third focus may be a value obtained by adding the predetermined focus deviation to the first focus.

The focus deviation may be twice the focus shift amount to be detected.

The generating of the first contour band may include generating a first contour of the mask pattern at the first focus, generating a second contour of the mask pattern at the second focus, and performing an XOR operation on the first contour and the second contour.

In the generating of a first contour, a shape of the mask pattern to be transferred onto a photosensitive layer may be simulated using an optical model.

The adjustment of the pattern of the photomask or the parameter of the exposure apparatus may comprise at least one of an optical proximity correction, a pattern size correction, a pattern position correction, an exposure dose correction, and a numerical aperture adjustment.

The pattern of the photomask or the parameter of the exposure apparatus may be adjusted before providing the semiconductor substrate to the exposure apparatus.

BRIEF DESCRIPTION OF THE DRAWINGS

The above and other features and advantages of the present inventive concept will become more apparent by describing embodiments in detail with reference to the attached drawings in which:

FIGS. 8 to 10 are views illustrating focus shift prediction and a focus shift amount which may be obtained through the process of FIG. 5;

DETAILED DESCRIPTION OF THE INVENTION

Figure 1:
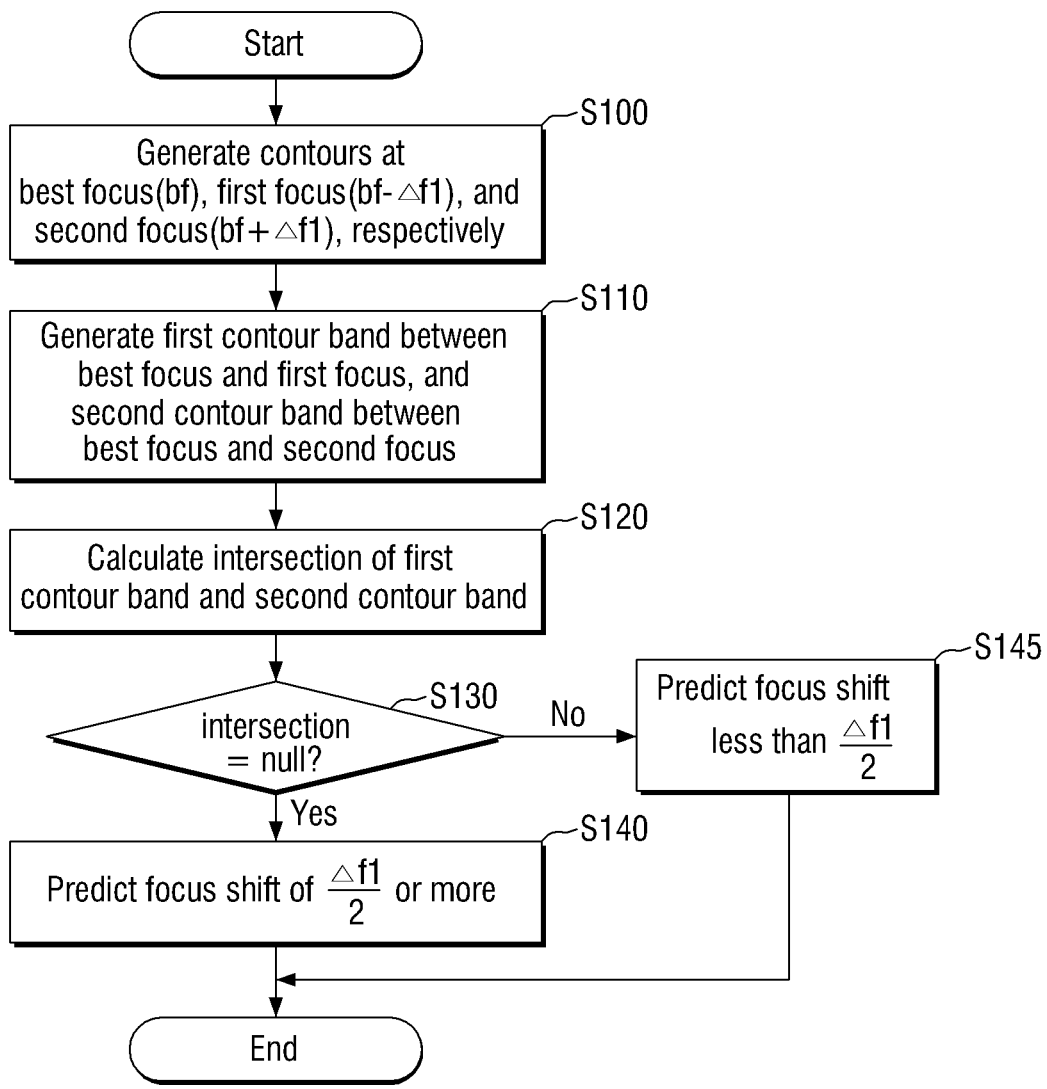
FIG. 1 is a flowchart illustrating a focus shift detecting method of a lithography process according to an embodiment of the present inventive concept.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. In the drawings, the sizes and relative sizes of layers and regions may be exaggerated for clarity. The present inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, or as "contacting" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, a focus shift detecting method of a lithography process according to an embodiment of present inventive concept will be described with reference to FIGS. 1 to 4C.

Figure 2A:
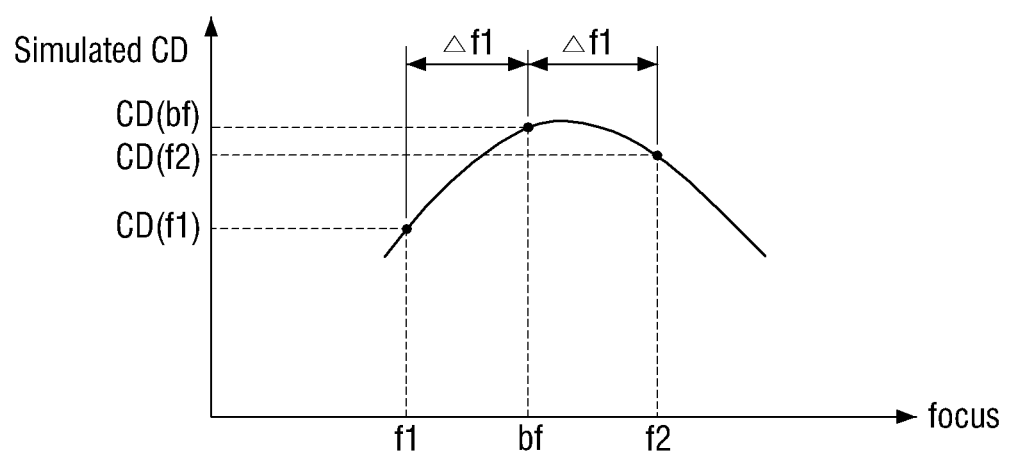
FIGS. 2A to 2C are views illustrating a step S100 of FIG. 1.
Figure 2A:
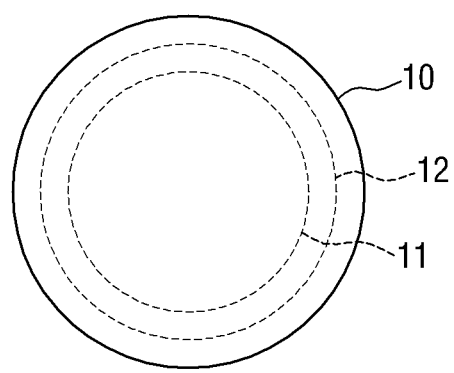
Figure 2B:
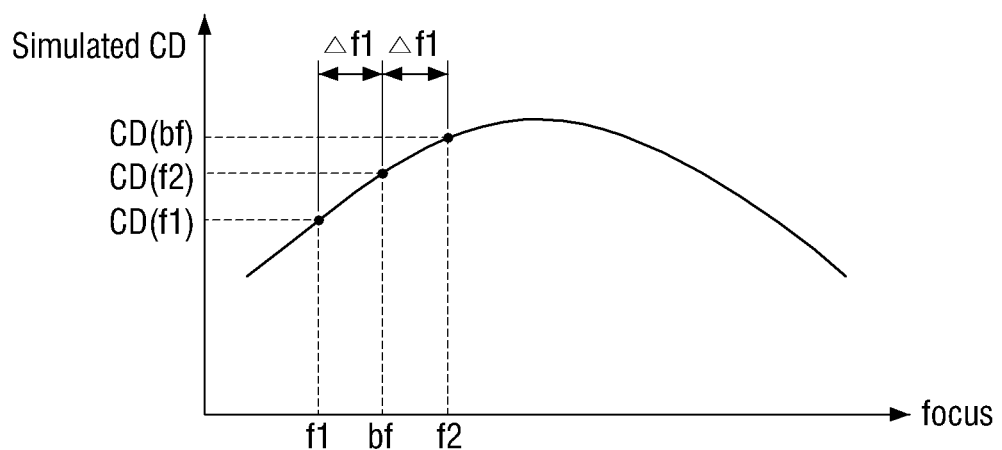
Figure 2B:
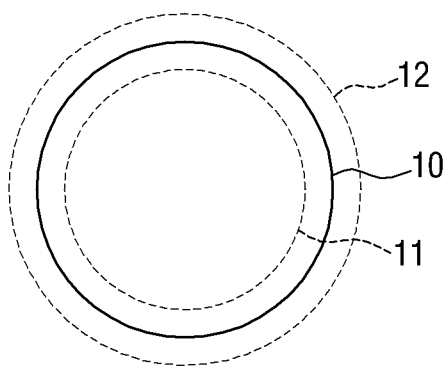
Figure 2C:
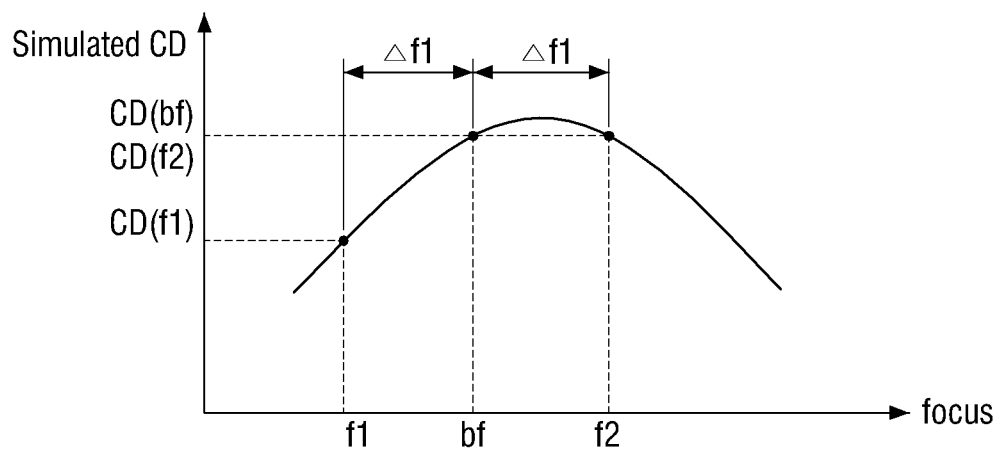
Figure 2C:
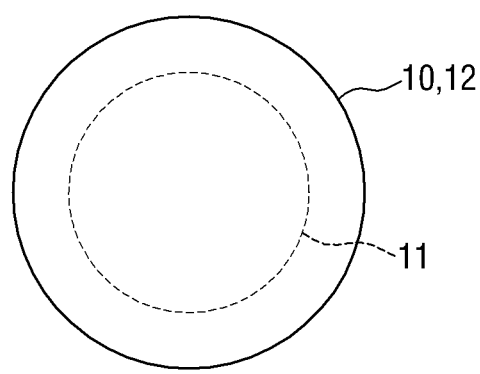
Figure 3A:
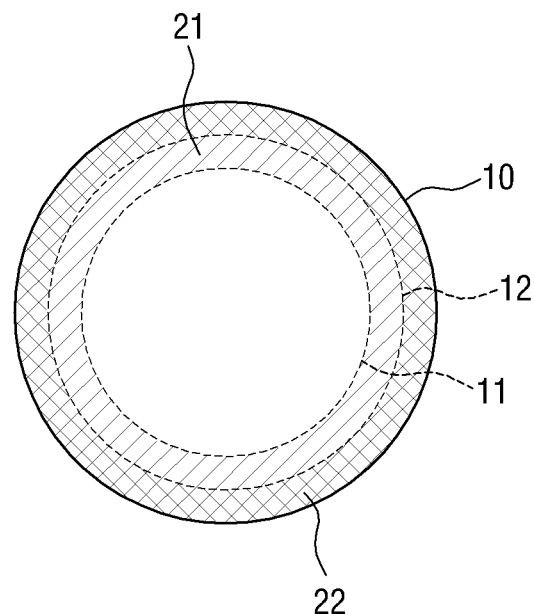
FIGS. 3A to 3C are views illustrating a step S110 and a step S120 of FIG. 1.
Figure 3B:
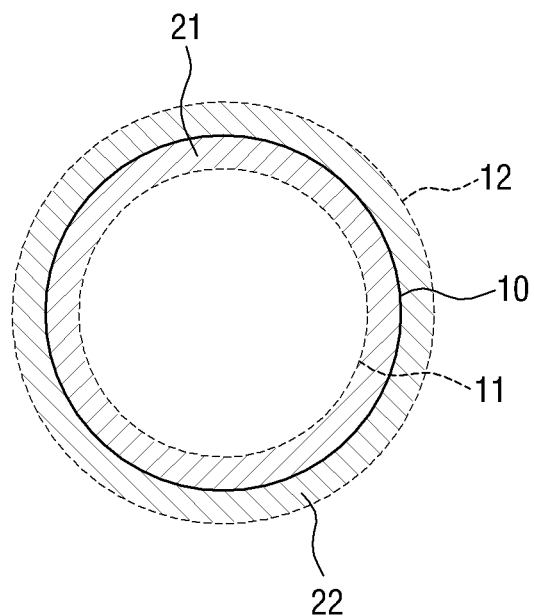
Figure 3C:
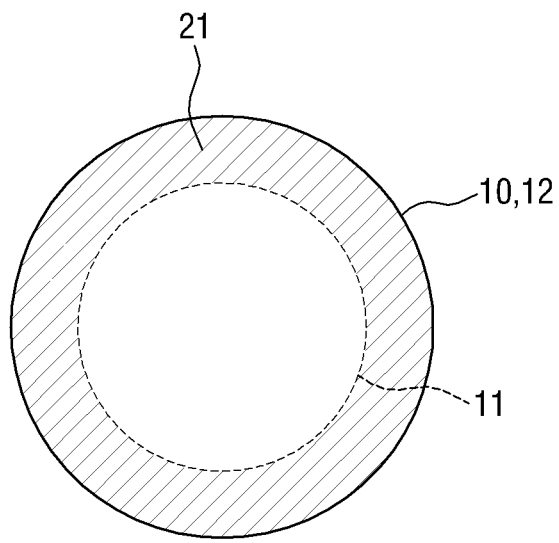
Figure 4A:
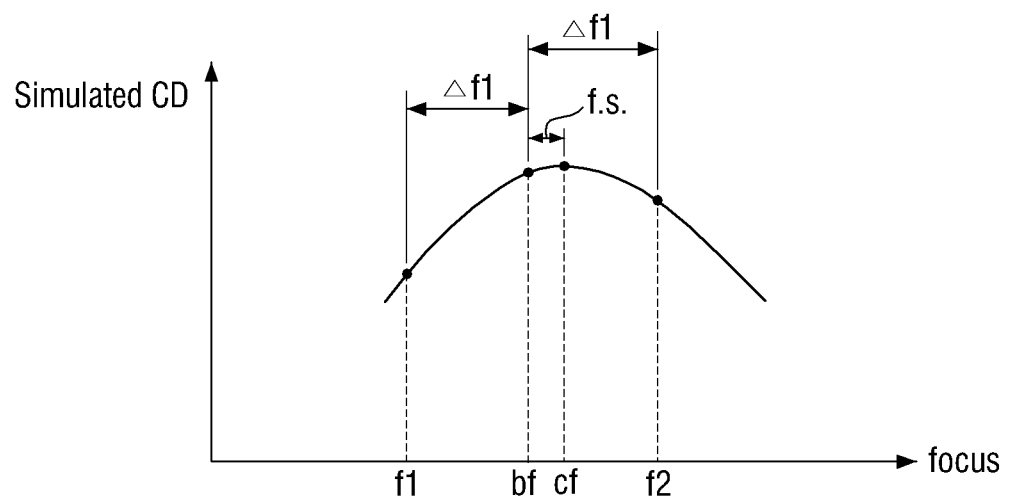
FIGS. 4A to 4C are views illustrating a step S130, a step S140, and a step S145 of FIG. 1.
Figure 4B:
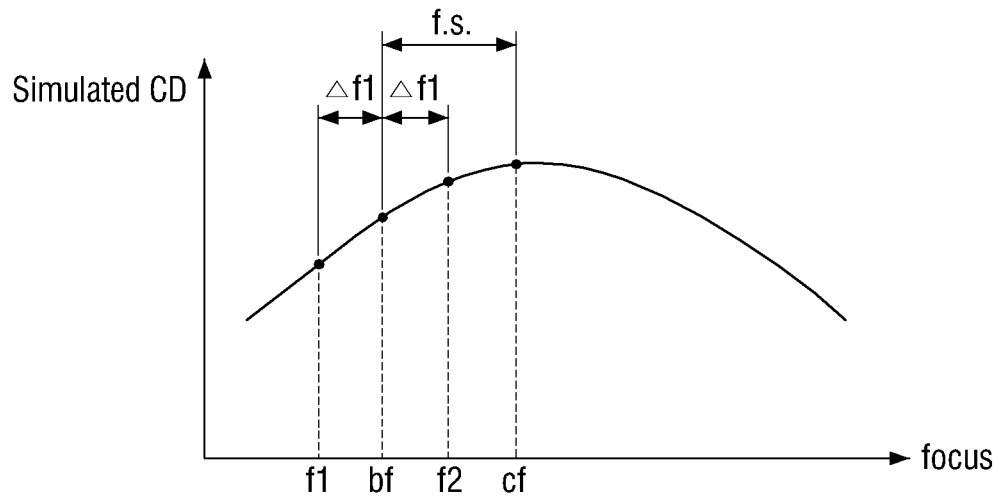
Figure 4C:
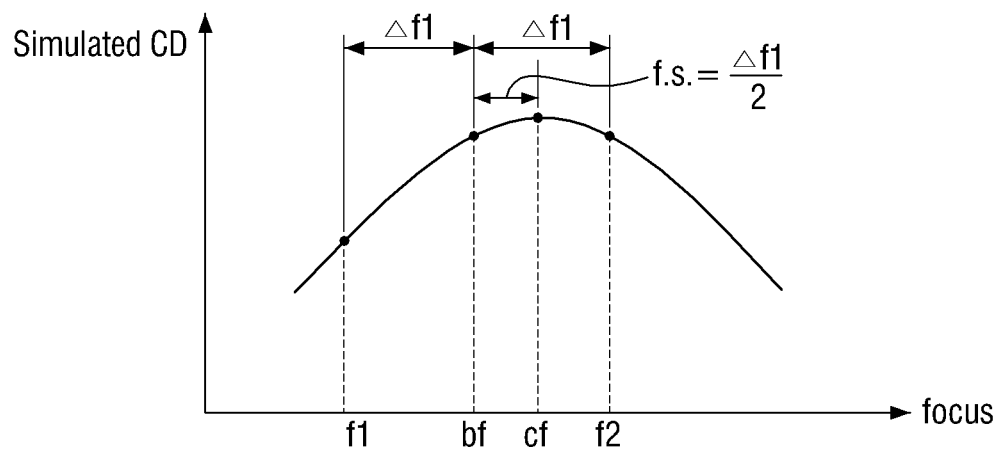

FIG. 1 is a flowchart illustrating a focus shift detecting method of a lithography process according to an embodiment of the present inventive concept. FIGS. 2A to 2C are views each illustrating a step S100 of FIG. 1. FIGS. 3A to 3C are views each illustrating a step S110 and a step S120 of FIG. 1. FIGS. 4A to 4C are views each illustrating a step S130, a step S140, and a step S145 of FIG. 1.

Referring to FIGS. 1 to 2C, a best contour 10, a first contour 11, and a second contour 12 for a mask pattern are generated in step S100.

For example, the best contour 10 of the mask pattern is generated at a best focus bf, the first contour 11 of the mask pattern is generated at a first focus f1, and the second contour 12 of the mask pattern is generated at a second focus f2. For example, the best focus bf may be a focus of a particular pattern that can be obtained with a particular photomask and process. For example, the best focus may be obtained by taking into account particular conditions in a simulation tool, for example, adjacent patterns, mask structures and/or other effects of a mask and process may be reflected in the best focus bf. For example, mask 3D effects may be taken into account to determine the best focus bf. Therefore, the best focus bf of a particular pattern or position may be different from an "ideal focus" of the particular pattern or position. For example, the best focus bf may shift from the "ideal focus" which is a desirable focus for the particular pattern without consideration of other factors. Therefore, it may be required to modify the pattern or other structures of the mask to get a better focus when it is determined that the best focus bf is shifted out of specification. In addition or alternatively, it may be required to modify some process conditions to get a better focus when the best focus bf is shifted out of specification.

The best contour 10 of the mask pattern is simulated at the best focus bf using an optical model. The best contour 10 is different from a shape which is actually transferred onto a photosensitive layer in a lithography process. The best contour 10 may have a simulation shape obtained by theoretically calculating a shape of the mask pattern to be transferred onto the photosensitive layer by an exposing apparatus in the lithography process.

In one embodiment, the first contour 11 and the second contour 12 of the mask pattern are simulated using an optical model at the first focus f1 and the second focus f2. The first contour 11 and the second contour 12 also may have simulation shapes which are theoretically calculated.

The first focus f1 may have a value obtained by subtracting a first focus deviation $\Delta f1$ from the best focus bf and the second focus f2 may have a value obtained by adding the first focus deviation $\Delta f1$ to the best focus bf. For example, in one embodiment a median of a value obtained by adding the first focus f1 and the second focus f2 is the best focus bf. Thus, the best focus bf may be the median value of the first focus f1 and the second focus f2.

The first contour 11 is a contour of a mask pattern which is simulated at the first focus f1 which is smaller than the best focus bf as much as the first focus deviation $\Delta f1$ and the second contour 12 is a contour of the mask pattern which is simulated at the second focus f2 which is larger than the best focus bf as much as the first focus deviation $\Delta f1$.

In the focus shift detecting method of the lithography process according to the embodiments of the present inventive concept, the optical model which is used to simulate the best contour 10, the first contour 11, and the second contour 12 may be a Mask 3D model.

This is because only when the mask pattern is actually configured by an opening having a predetermined thickness, a phase of a light source which is provided from a light source of the exposing apparatus may be changed depending on a position of the opening.

In the focus shift detecting method of the lithography process according to an embodiment of the present inventive concept, the first focus deviation $\Delta f1$ may be related with a focus shift value to be detected in the lithography process by user. For example, the first focus deviation $\Delta f1$ may be two times a focus shift value to be detected by the user. For example, a user may set $\Delta f1$ as double the value of the focus tolerance in the lithography process.

For example, when the user wants to know a pattern whose focus is shifted by 10 nm or less or a pattern whose focus is shifted by 10 nm or more among a plurality of mask patterns that are used in the lithography process in order to implement a semiconductor integrated circuit element, the first focus deviation Δf1 may be 20 nm.

Figure 8:
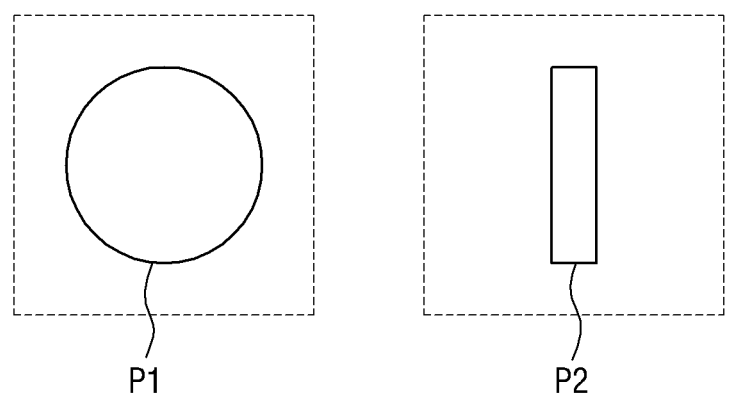

FIGS. 2A through 2C illustrate a focus shift detecting method of the lithography process according to an embodiment of the present inventive concept. The mask pattern has a circular shape in these figures (as also shown in some other figures, for example, see P1 of FIG. 8), but this is for convenience of the description and the present disclosure is not limited thereto. Therefore, the mask pattern may have another shape. For example, P2 of FIG. 8 is a rectangular shape.

In the focus shift detecting method of the lithography process according to the embodiment of the present inventive concept, the best focus bf may be a focus of a light source of the exposing apparatus which is actually used in the lithography process.

FIG. 2A illustrates that the best contour 10 of the mask pattern is larger than the first contour 11 of the mask pattern and the second contour 12 of the mask pattern. That is, FIG. 2A illustrates a case when a critical dimension CD of the simulated best contour 10 is larger than a CD of the simulated first contour 11 and a CD of the simulated second contour 12.

FIG. 2B illustrates that the best contour 10 of the mask pattern is located between the first contour 11 of the mask pattern and the second contour 12 of the mask pattern. For example, FIG. 2B illustrates a case when the CD of the simulated best contour 10 is present between the CD of the simulated first contour 11 and the CD of the simulated second contour 12.

Even though FIG. 2B illustrates that the second contour 12 is the largest one, this is for convenience of description and the present disclosure is not limited thereto. For example, the second contour 12 may be smaller than or the same as one of the first contour 11 and the best contour 10, some of which are shown in some other embodiments of the present disclosure.

FIG. 2C illustrates a case when the size of the best contour 10 of a mask pattern and the size of the second contour 12 of the mask pattern are substantially equal to each other and the size of the best contour 10 of the mask pattern is different from the size of the first contour 11 of the mask pattern. For example, even though the CD of the simulated best contour 10 is the same as the CD of the simulated second contour 12, the CD of the simulated best contour 10 may be different from the CD of the simulated first contour 11.

Even though FIG. 2C illustrates that the best contour 10 and the second contour 12 are substantially the same and the first contour 11 is smaller than the best contour 10, this is for convenience of the description and the present disclosure is not limited thereto.

FIGS. 2A to 2C illustrate contours and CD changes of the contours in accordance with the focus shift. That is, FIGS. 2A to 2C illustrate exemplary Bossung diagrams (or Bossung plots) illustrating CD changes of the contours simulated in accordance with the focus shift.

Even though the Bossung diagrams illustrated in FIGS. 2A to 2C have maximum points, this is for convenience of the description and the present disclosure is not limited thereto. For example, one or more of the Bossung diagrams illustrated in FIGS. 2A to 2C may also have a minimum point. For example, the curve of a Bossung diagram may depend on an exposure dose of a lithography process.

In FIG. 2C, since the size of the best contour 10 of the mask pattern and the size of the second contour 12 of the mask pattern are substantially the same, when a position of the best focus moves in the Bossung diagram for the mask pattern, the Bossung diagram illustrated in 2C may be changed as illustrated in the Bossung diagram of FIG. 2A or the Bossung diagram of FIG. 2B.

For example, when the position of the best focus moves in the Bossung diagram for the mask pattern, the best contour 10, the first contour 11, and the second contour 12 of FIG. 2C may be changed to the best contour 10, the first contour 11, and the second contour 12 illustrated in FIG. 2A or 2B.

As for a reference, the case illustrated in FIG. 2C may be a boundary state to determine whether there is a focus shift. It may also be a reference value to determine a focus shift amount in later steps.

Referring to FIGS. 1 and 3A to 3C, a first contour band 21 of the mask pattern is generated between the best focus bf and the first focus f1 and a second contour band 22 of the mask pattern is generated between the best focus bf and the second focus f2 in step S110.

The first contour band 21 is generated using the best contour 10 of the mask pattern and the first contour 11 of the mask pattern. More specifically, an exclusive logical sum between the best contour 10 and the first contour 11 is obtained to generate the first contour band 21. For example, an exclusive OR (XOR) operation is performed on the best contour 10 and the first contour 11 to generate the first contour band 21.

The second contour band 22 is generated using the best contour 10 of the mask pattern and the second contour 12 of the mask pattern. More specifically, an exclusive logical sum between the best contour 10 and the second contour 12 is obtained to generate the second contour band 22.

The first contour band 21 may be a space between the best contour 10 and the first contour 11 and the second contour band 22 may be a space between the best contour 10 and the second contour 12.

FIGS. 3A and 3B illustrate cases when the first contour band 21 and the second contour band 22 are generated. In contrast, FIG. 3C illustrates a case when the first contour band 21 is generated but the second contour band 22 is not generated. In FIG. 3C, the second contour 12 and the best contour 10 are substantially the same so that the second contour band 22 is not generated.

Referring to FIGS. 1 and 3A to 3C, an intersection of the first contour band 21 and the second contour band 22 is calculated using the first contour band 21 and the second contour band 22 in step S120.

A logical product between the first contour band 21 and the second contour band 22 is calculated to calculate the intersection of the first contour band 21 and the second contour band 22. An AND operation is performed on the first contour band 21 and the second contour band 22 to calculate the intersection of the first contour band 21 and the second contour band 22.

FIG. 3A illustrates a case when the intersection is present between the first contour band 21 and the second contour band 22. That is, since the best contour 10 of the mask pattern is larger than the first contour 11 of the mask pattern and the second contour 12 of the mask pattern, the first contour band 21 between the best contour 10 and the first contour 11 and the second contour band 22 between the best contour 10 and the second contour 12 have an intersection.

FIGS. 3B and 3C illustrate cases which have no intersection between the first contour band 21 and the second contour band 22.

In FIG. 3B, since the best contour 10 of the mask pattern is positioned between the first contour 11 of the mask pattern and the second contour 12 of the mask pattern, the first contour band 21 between the best contour 10 and the first contour 11 and the second contour band 22 between the best contour 10 and the second contour 12 do not intersect.

In FIG. 3C, the size of the best contour 10 of the mask pattern and the size of the second contour 12 of the mask pattern are substantially the same, so that there is no second contour band 22. Therefore, in FIG. 3C, there is no intersection between the first contour band 21 between the best contour 10 and the first contour 11 and the second contour band 22 between the best contour 10 and the second contour 12.

FIG. 3C illustrates a boundary which determines whether there is an intersection between the first contour band 21 and the second contour band 22.

Referring to FIG. 1 and FIGS. 3A to 4C, it is determined whether the focus of the mask pattern moves in the lithography process using the intersection of the first contour band 21 and the second contour band 22 in step S130.

In step S145, when the first contour band 21 and the second contour band 22 intersect, it is predicted that the focus shift in the mask pattern is less than half the first focus deviation Δf1 in the lithography process. Accordingly, when the first contour band 21 and the second contour band 22 intersect, it may be determined that there is no focus shift in the mask pattern in the lithography process. For example, it may be determined that the focus shift is within the process specification. (e.g. within numerical boundaries set in a product specification or industry standard)

In step S140, it is predicted and supposed that the focus of the mask pattern may shift by a value equal to or more than half of the first focus deviation Δf1 in the lithography process when the first contour band 21 and the second contour band 22 do not intersect. Accordingly, when the first contour band 21 and the second contour band 22 do not intersect, it may be determined that focus shift in the mask pattern occurs in the lithography process. For example, it may be determined that the focus shift is out of specification.

Therefore, when the first contour band 21 and the second contour band 22 intersect, it may be determined that focus shift does not occur in the transferred mask pattern on the photosensitive layer. For example, it may be determined that the amount of the focus shift is acceptable. When the first contour band 21 and the second contour band 22 do not intersect, it may be determined that focus shift occurs in the transferred mask pattern. For example, it may be determined that the focus shift amount is not acceptable.

In FIGS. 3C and 4C, the intersection of the first contour band 21 and the second contour band 22 is null, so that it is predicted that the focus shift in the mask pattern may occur in the lithography process.

As illustrated in FIGS. 2C and 3C, FIG. 4C illustrates a boundary to determine whether there is an intersection between the first contour band 21 and the second contour band 22. For example, when the focus shift in the mask pattern occurs in the lithography process, the focus shift amount f.s. of the mask pattern may be calculated with reference to FIG. 4C.

For example, a center focus cf of the mask pattern is located at the center between the best focus bf and the second focus f2 obtained by adding the first focus deviation Δf1 to the best focus bf of the exposing apparatus. For example, the difference between the best focus bf and the second focus f2 is the first focus deviation Δf1 so that the difference between the best focus bf and the center focus cf of the mask pattern is half the first focus deviation Δf1. For example, the center focus cf may be an "ideal focus" for the pattern when the ambient patterns and other structures of the mask are not taken into account. However, the best focus bf may shift from the center focus cf because focuses of the other patterns of the mask should be taken into account, and because some other process parameters affect the focus of the pattern. For example, numerical aperture of the exposure equipment may affect the focus of each pattern.

For example, it is determined that the focus shift f.s. of the mask pattern will occur in the lithography process, and the focus shift amount f.s. of the mask pattern is equal to or more than half the first focus deviation Δf1.

It is determined that the focus shift in the mask pattern will not occur in the lithography process when the focus shift amount f.s. of the mask pattern is less than half the first focus deviation Δf1.

In FIGS. 3A and 4A, the first contour band 21 and the second contour band 22 intersect, so that it is predicted that the focus shift in the mask pattern may not occur in the lithography process. For example, the focus shift amount f.s. of the mask pattern is predicted to be less than half the first focus deviation Δf1.

In FIGS. 3B and 4B, the intersection of the first contour band 21 and the second contour band 22 is null set, so that it is predicted that the focus shift of the mask pattern may occur in the lithography process. For example, the focus shift amount f.s. of the mask pattern is predicted to be equal to or more than half the first focus deviation Δf1.

Hereinafter, effects of the present inventive concept will be described.

To confirm focus shift of the mask pattern in the lithography process, at least three pieces of CD data are required. Further, parabolic least square fit is performed on each mask pattern using three or more pieces of CD data so that a quadratic function graph for each mask pattern is calculated.

The quadratic function graph obtained for each of the mask patterns by the above method is used to compare the best focus of the exposing apparatus and the center focus of each of the mask patterns and the focus shift of each of the mask patterns is confirmed therethrough.

For example, when the focus shift is confirmed by a direct method for each of the mask patterns that are used for the semiconductor integrated circuit element, a substantial amount of data may need to be processed.

However, according to an embodiment of the present inventive concept, a simple XOR operation and an AND operation are performed on a contour for a best focus, a contour for a first focus, and a contour for a second focus of each of the mask patterns which is used for the semiconductor integrated circuit element. For example, XOR operations may be performed on the contours and an AND operation may be performed on the first band and the second band. Accordingly, it is determined whether there is an intersection, so that it is possible to rapidly predict whether focus shift for each of the mask patterns occurs.

For example, the focus shift of the mask pattern may be determined through simulation without determining the focus shift using an actual mask pattern, so that whether there is focus shift may be determined for all mask patterns which are used for the semiconductor integrated circuit element.

A focus shift detecting method of the lithography process according to another embodiment of the present inventive concept will be described with reference to FIGS. 2B, 3B, 4B, and 5 to 10.

Figure 5:
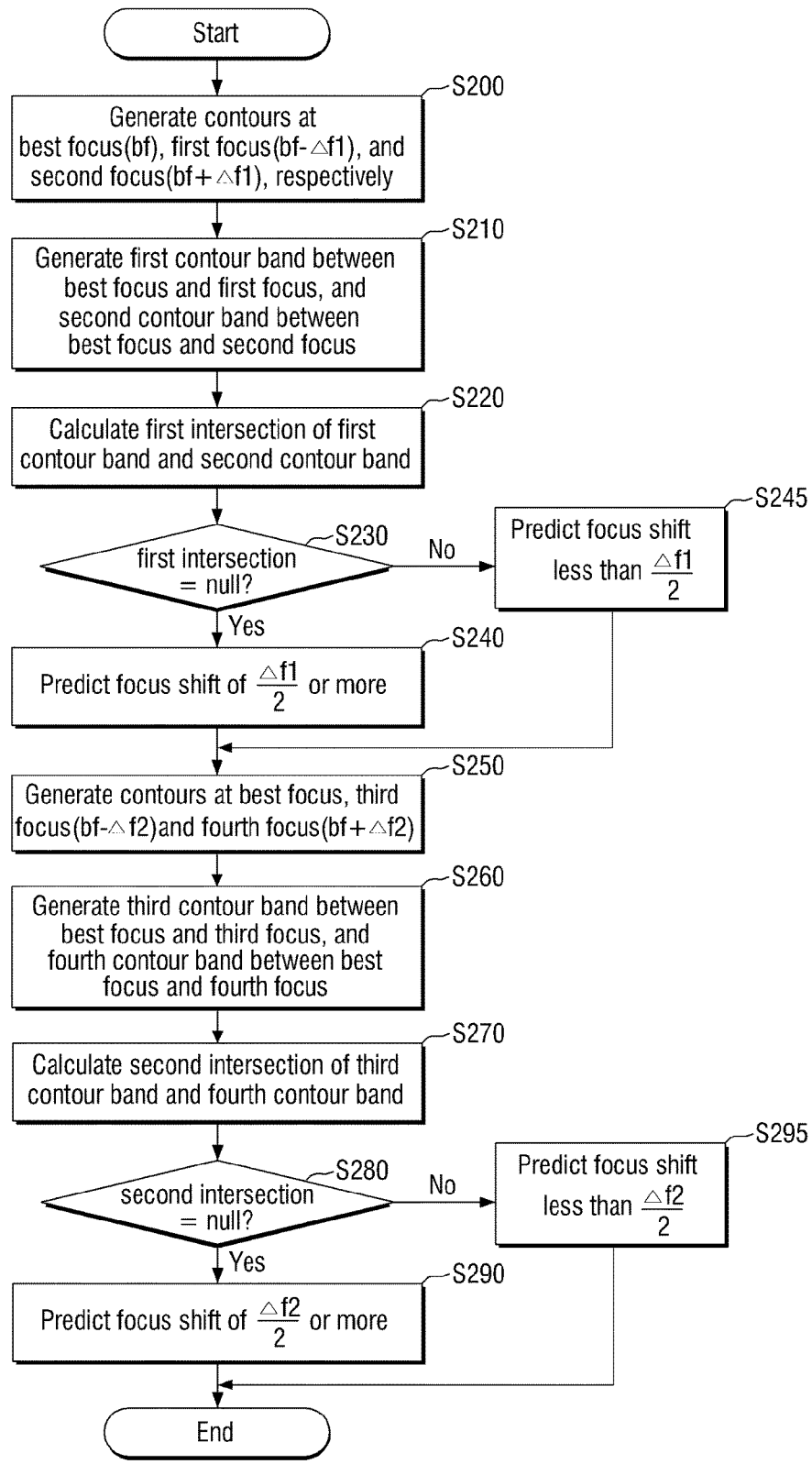
FIG. 5 is a flowchart illustrating a focus shift detecting method of a lithography process according to another embodiment of the present inventive concept.
Figure 6:
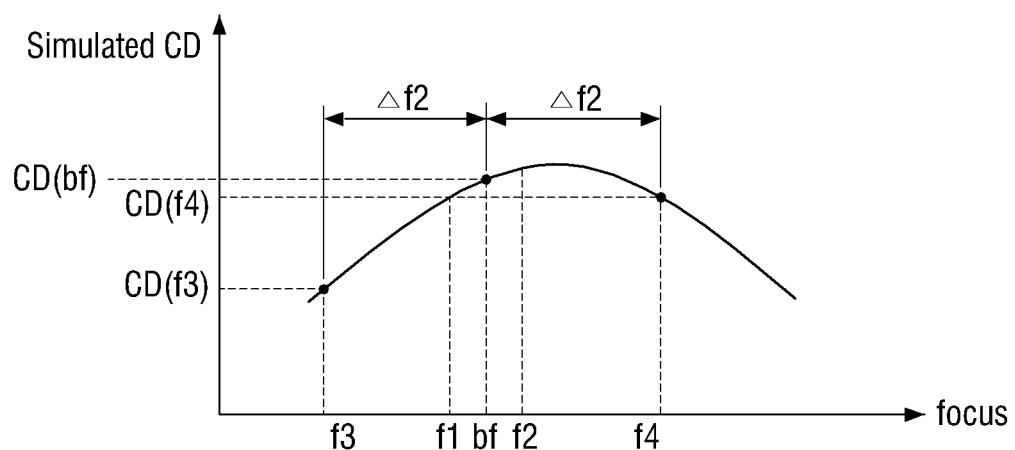
FIG. 6 is a view illustrating steps S250 to S270 of FIG. 5.
Figure 6:
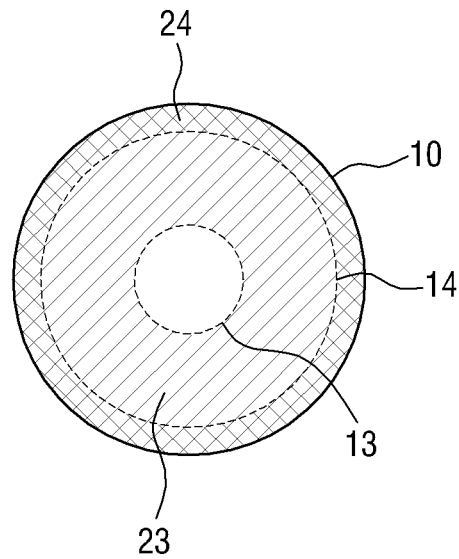
Figure 7:
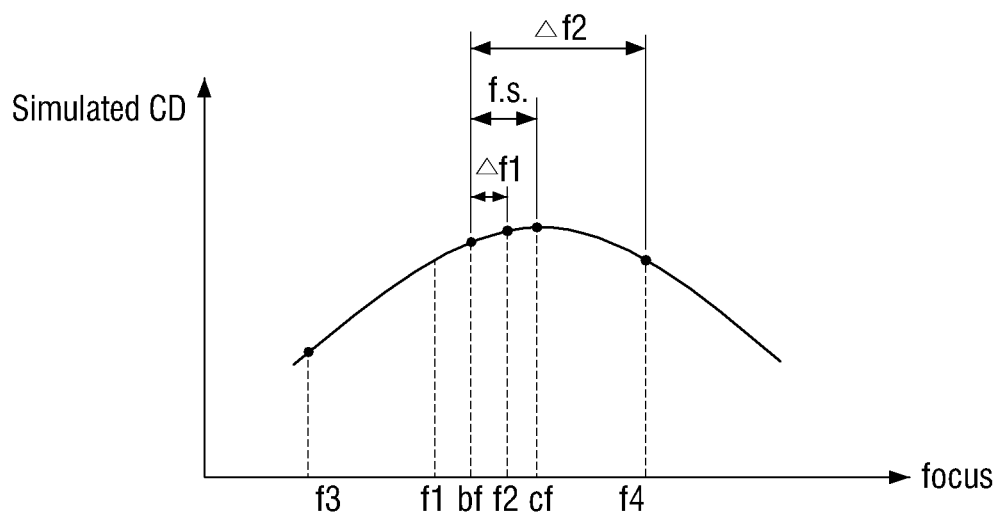
FIG. 7 is a view illustrating a step S280, a step S290, and a step S295 of FIG. 5.

FIG. 5 is a flowchart illustrating a focus shift detecting method of a lithography process according to an embodiment of the present inventive concept. FIG. 6 is a view illustrating steps S250 to S270 of FIG. 5. FIG. 7 is a view illustrating a step S280, a step S290, and a step S295 of FIG. 5. FIGS. 8 to 10 are views illustrating focus shift estimation and focus shift amount which may be obtained through the process of FIG. 5.

Referring to FIGS. 2B, 3B, 4B, 5, 8, and 9, a best contour 10, a first contour 11, and a second contour 12 for a first mask pattern P1 are generated in step S200.

It is illustrated that a best contour 10 of the first mask pattern P1 is located between the first contour 11 of the first mask pattern P1 and the second contour 12 of the first mask pattern P1. For example, it is illustrated that the CD of the simulated best contour 10 is present between the CD of the simulated first contour 11 and the CD of the simulated second contour 12.

A first contour band 21 of the first mask pattern P1 is generated between the best focus bf and the first focus f1 and a second contour band 22 of the first mask pattern P1 is generated between the best focus bf and the second focus f2 in step S210.

An intersection of the first contour band 21 and the second contour band 22 is calculated using the first contour band 21 and the second contour band 22.

Since the best contour 10 of the first mask pattern P1 is positioned between the first contour 11 of the first mask pattern P1 and the second contour 12 of the first mask pattern P1, the first contour band 21 between the best contour 10 and the first contour 11 and the second contour band 22 between the best contour 10 and the second contour 12 do not intersect.

It is determined whether there is focus shift of the first mask pattern P1 in the lithography process using the intersection of the first contour band 21 and the second contour band 22 in step S230.

In FIGS. 3B, 4B, and 9, an intersection of the first contour band 21 and the second contour band 22 is a null set, so that it is predicted that the focus shift of the first mask pattern P1 may occur in the lithography process. Further, the focus shift amount f.s. of the first mask pattern P1 is predicted to be equal to or more than half the first focus deviation $\Delta f1$.

The generation of the first contour 11, the second contour 12, and the best contour 10 and calculation of an intersection by generating the first contour band 21 and the second contour band 22 have been described with reference to FIGS. 1 to 4C, and the description can be referred for this embodiment also, so that the detailed description thereof is omitted here.

Referring to FIGS. 5 and 6, a best contour 10, a third contour 13, and a fourth contour 14 of the first mask pattern P1 are generated in step S250.

For example, the best contour 10 of the first mask pattern P1 is generated at a best focus bf, the third contour 13 of the first mask pattern P1 is generated at a third focus f3, and the fourth contour 14 of the first mask pattern P1 is generated at a fourth focus f4.

The third focus f3 has a value obtained by subtracting a second focus deviation $\Delta f2$ from the best focus bf and the fourth focus f4 has a value obtained by adding the second focus deviation $\Delta f2$ to the best focus bf. For example, a median value of a value obtained by adding the third focus f3 and the fourth focus f4 is the best focus bf.

Even though FIG. 6 illustrates that the second focus deviation $\Delta f2$ is larger than the first focus deviation $\Delta f1$ in FIG. 2, this is for the convenience of description and the present disclosure is not limited thereto. For example, the second focus deviation may be smaller than or same as the first focus deviation.

However, in the subsequent description, it is described that the second focus deviation $\Delta f2$ is larger than the first focus deviation $\Delta f1$. For example, it is described that a first difference between the best focus bf and the first focus f1 is smaller than a second difference between the best focus bf and the third focus f3.

In FIG. 6, a best contour 10 of the first mask pattern P1 is located between the third contour 13 of the first mask pattern P1 and the fourth contour 14 of the first mask pattern P1. For example, the CD of the simulated best contour 10 is present between the CD of the simulated first contour 13 and the CD of the simulated fourth contour 14.

Next, a third contour band 23 of the first mask pattern P1 is generated between the best focus bf and the third focus f3 and a fourth contour band 24 of the first mask pattern P1 is generated between the best focus bf and the fourth focus f4 in step S260.

An exclusive logical sum between the best contour 10 and the third contour 13 is calculated to generate the third contour band 23. Further, an exclusive logical sum between the best contour 10 and the fourth contour 14 is calculated to generate the fourth contour band 24.

Next, an intersection of the third contour band 23 and the fourth contour band 24 is calculated using the third contour band 23 and the fourth contour band 24 in step S270.

A logical product between the third contour band 23 and the fourth contour band 24 is calculated to calculate the intersection of the third contour band 23 and the fourth contour band 24.

In FIG. 6, there is an intersection between the third contour band 23 and the fourth contour band 24. That is, since the best contour 10 of the first mask pattern P1 is larger than the third contour 13 of the first mask pattern P1 and the fourth contour 14 of the first mask pattern P1, the third contour band 23 between the best contour 10 and the third contour 13 and the fourth contour band 24 between the best contour 10 and the fourth contour 14 intersect.

Therefore, when comparing FIGS. 3B and 6, an intersection between the first contour band 21 between the best contour 10 and the first contour 11 and the second contour band 22 between the best contour 10 and the second contour 12 is null set. However, an intersection between the third contour band 23 between the best contour 10 and the third contour 13 and the fourth contour band 24 between the best contour 10 and the fourth contour 14 is not a null set.

For example, when the contour and the contour band of the first mask pattern P1 are generated using the second focus deviation $\Delta f2$ which is larger than the first focus deviation $\Delta f1$, the third contour band 23 and the fourth contour band 24 intersect.

Referring to FIGS. 5 to 7, 9, and 10, it is determined whether the focus shift of the first mask pattern P1 occurs in the lithography process using the intersection of the third contour band 23 and the fourth contour band 24 in steps 280, 290, and 295.

In FIGS. 6, 7, and 9, an intersection of the third contour band 23 and the fourth contour band 24 is not a null set, so that it is predicted that the focus shift of the first mask pattern P1 may not occur in the lithography process. Further, the focus shift amount f.s. of the first mask pattern P1 is predicted to be less than half the second focus deviation $\Delta f2$.

Moreover, it is possible to predict for the third focus deviation $\Delta f3$ and the fourth focus deviation $\Delta f4$ which are larger than the second focus deviation $\Delta f2$, whether the focus shift of the first mask pattern P1 occurs through the above-described method.

Even though not illustrated in FIG. 5, additionally, it is possible to determine a focus shift range of the first mask pattern P1 using an intersection between the first contour band 21 and the second contour band 22 and an intersection between the third contour band 23 and the fourth contour band 24.

For example, in FIG. 4b, it is predicted that the focus shift amount f.s. of the first mask pattern P1 is equal to or more than half the first focus deviation $\Delta f1$ using the intersection between the first contour band 21 and the second contour band 22.

In FIG. 6, it is predicted that the focus shift amount f.s. of the first mask pattern P1 is less than half the second focus deviation $\Delta f2$ using the intersection between the third contour band 23 and the fourth contour band 24.

Referring to FIG. 10, the focus shift amount f.s. of the first mask pattern P1 may be equal to or more than half of the first focus deviation $\Delta f1$ and lower than half of the second focus deviation $\Delta f2$ in the lithograph process.

However, differently from FIGS. 6 and 7, but similarly to FIG. 3B or 3C, it may be assumed that an intersection between the third contour band 23 between the best contour 10 and the third contour 13 and the fourth contour band 24 between the best contour 10 and the fourth contour 14 is a null set. In this case, it is predicted that the focus shift amount f.s. of the first mask pattern P1 is equal to or more than half the second focus deviation $\Delta f2$ using the intersection between the third contour band 23 and the fourth contour band 24.

Therefore, when both the intersection between the first contour band 21 and the second contour band 22 and the intersection between the third contour band 23 and the fourth contour band 24 are null set, the focus shift amount f.s. of the first mask pattern P1 in the lithography process may be equal to or more than the second focus deviation $\Delta f2$.

Similarly to FIG. 3A, when both the intersection between the first contour band 21 and the second contour band 22 and the intersection between the third contour band 23 and the fourth contour band 24 are not null set, the focus shift amount f.s. of the first mask pattern P1 in the lithography process may be less than half the first focus deviation $\Delta f1$.

Similarly to estimating whether the focus shift of the first mask pattern P1 occurs, it may also be predicted whether the focus shift of the second mask pattern P2 of FIG. 8 occurs by the above-described method.

It is possible to predict whether the focus shift of the second mask pattern P2 occurs through the method as described above for the first focus deviation $\Delta f1$, the second focus deviation $\Delta f2$, the third focus deviation $\Delta f3$, and the fourth focus deviation $\Delta f4$.

As illustrated in FIG. 9, it is possible to predict that the focus shift of the second mask pattern P2 does not occur for the first focus deviation $\Delta f1$, the second focus deviation $\Delta f2$, the third focus deviation $\Delta f3$, and the fourth focus deviation $\Delta f4$.

In this case, referring to FIG. 10, the focus shift amount f.s. of the second mask pattern P2 may be less than half the first focus deviation $\Delta f1$ in the lithography process.

The focus shift amount of the second mask pattern P2 may be obtained by detecting the focus shift of the lithography process for a focus shift which is smaller than the first focus deviation $\Delta f1$.

It is possible to predict not only whether the focus shift occurs for a plurality of mask patterns for forming a semiconductor integrated circuit element using the focus shift detecting method of the lithography process according to embodiments of the present inventive concept but also the focus shift amount of each of the mask patterns.

In an embodiment, these plural levels of a focus shift detecting method and a focus shift amount defining method may be applied to different levels of CD sensitivity patterns. A smaller focus deviation analysis, for example $\Delta f1$, may be applied to a highly sensitive pattern, so that highly sensitive patterns are controlled strictly. A larger focus deviation analysis, for example $\Delta f2$, may be applied to a low sensitive pattern, so that low sensitive patterns are controlled relatively loosely. With this method, a better margin for a mask design or a lithography process design can be achieved. For example, multiple focus deviation degrees may be applied to determine photomask design or lithography process to apply different degrees of focus shift to each pattern in a photomask.

Referring to FIGS. 2A to 4C, 11, and 12, a transferred pattern error analyzing method will be described hereinafter according to yet another embodiment of the present inventive concept.

Figure 11:
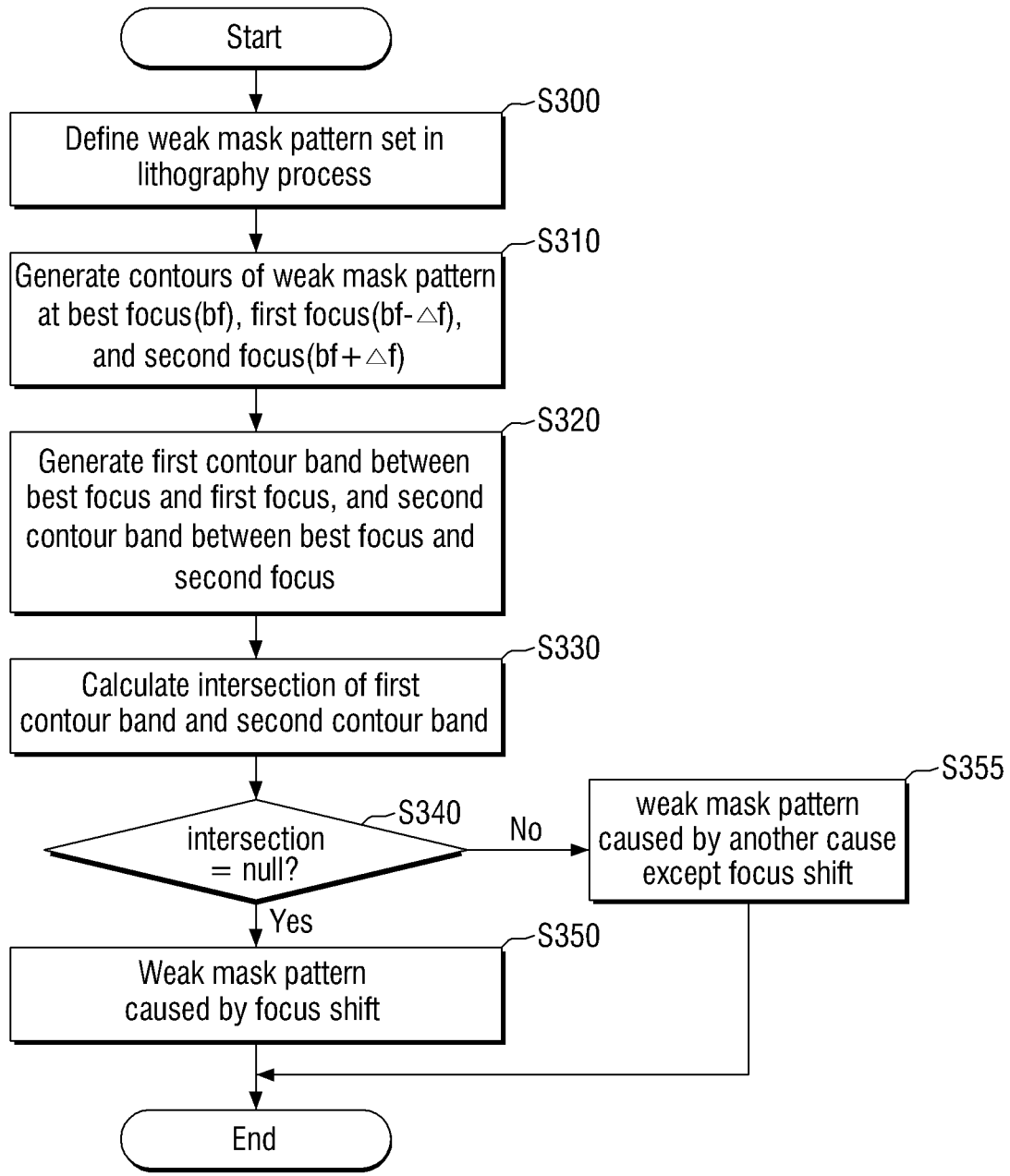
FIG. 11 is a flowchart illustrating a transferred pattern error analyzing method according to yet another embodiment of the present inventive concept.
Figure 12:
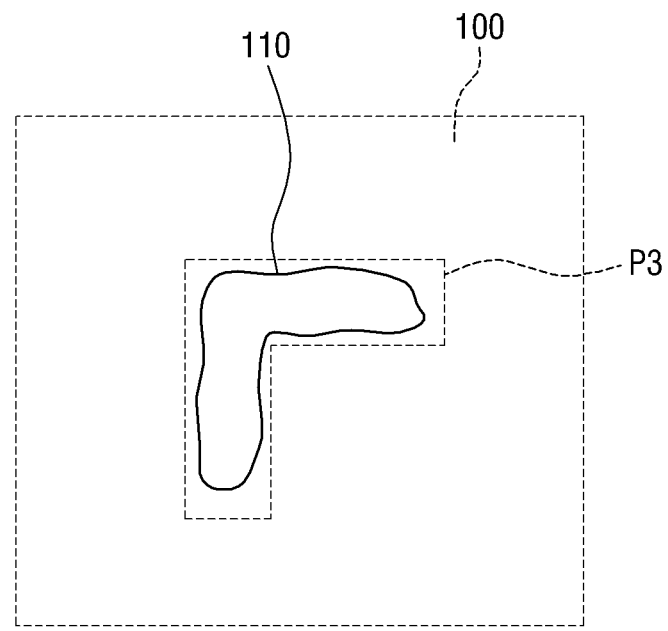
FIG. 12 is a view illustrating a step S300 of FIG. 11.

FIG. 11 is a flowchart illustrating a transferred pattern error analyzing method. FIG. 12 is a view illustrating a step S300 of FIG. 11.

Referring to FIGS. 11 and 12, a third mask pattern P3 which is weak in a lithography process is defined in step S300.

The third mask pattern P3 is transferred onto a photosensitive layer 100 through the lithography process. The transferred pattern 110 which is formed on the photosensitive layer 100 through the third mask pattern P3 may have a different shape from the third mask pattern P3.

Even though the photosensitive layer 100 is developed to form a photosensitive layer pattern, the transferred pattern 110 may not be developed well.

For example, the transferred pattern 110 of the third mask pattern P3 formed on the photosensitive layer 100 may be a bad pattern. For example, the transferred pattern 110 may have a poor shape. Therefore, the third mask pattern P3 may be a weak mask pattern in the lithography process.

Therefore, the third mask pattern P3 which is weak in the lithography process may be classified and defined using an actual shape which is transferred onto the photosensitive layer 100.

The reason for causing a weak mask pattern in the lithography process may be, for example, a focus shift of the mask pattern, an improper dose of the exposing apparatus or a poor uniformity of the mask.

Therefore, it is useful to find the reason for the weak mask pattern in the lithography process in order to solve the problem of the weak mask pattern in the lithography process.

Referring to FIG. 11, a best contour, a first contour, and a second contour for the third mask pattern P3 are generated in step S310.

Even though the mask pattern illustrated in FIGS. 2A to 2C has a different shape from the third mask pattern P3, the best contour, the first contour, and the second contour of the third mask pattern P3 may be generated by a method similar to the method of the embodiment described with regard to FIGS. 2A to 2C.

In a transferred pattern error analyzing method according to another embodiment of the present inventive concept, the focus deviation $\Delta f$ may be related with an available focus shift range of the mask pattern in the lithography process, for example, a permissible focus shift amount. For example, the focus deviation Δf may be two times as much as permissible focus shift amount of the mask pattern in the lithography process.

A first contour band and a second contour band of the third mask pattern P3 are generated in step S320. An intersection is calculated using the first contour band of the third pattern P3 and the second contour band of the third mask pattern P3 in step S330.

It is determined whether the focus shift of the third mask pattern P3 occurs using the calculated intersection of the first contour band of the third mask pattern P3 and the second contour band of the third mask pattern P3 in step S340.

In this case, when the intersection of the first contour band of the third mask pattern P3 and the second contour band of the third mask pattern P3 is null, it is determined that the focus shift of the third mask pattern P3 occurs in the lithography process.

For example, it may be determined that one of the reasons for the weak third mask pattern P3 in the lithography process is the focus shift of the third mask pattern P3.

When the intersection of the first contour band of the third mask pattern P3 and the second contour band of the third mask pattern P3 is not null, it is determined that the focus shift of the third mask pattern P3 does not occur in the lithography process.

For example, it may be determined that the weak third mask pattern P3 in the lithography process may be caused by other reasons excluding the focus shift of the third mask pattern P3.

A method for manufacturing a semiconductor device will be described hereinafter according to an embodiment of the present disclosure. The semiconductor device may be, for example, an ASIC chip or a memory like a NAND flash memory, a NOR flash memory, an EEPROM, or an MRAM (magneto-resistive random access memory).

A semiconductor device manufacturing method includes a plurality of photolithography processes. The various embodiments described above regarding detecting focus shift, determining focus shift amount, and/or analyzing error of transferred pattern may be utilized in the plurality of photolithography processes. After determining focus shift in various patterns of a photomask, the focus shift can be adjusted by modifying the patterns or structures of the photomask. This may include an optical proximity correction, a pattern size correction, and/or a pattern position correction. The focus shift information may also be used to adjust parameters of an exposure equipment. This adjustment may include, for example, a numerical aperture adjustment and/or an exposure dose correction.

For example, the manufacturing method may include providing a semiconductor substrate, coating a photosensitive layer on the substrate, exposing the photosensitive layer to a light pattern using a photomask, and developing the photosensitive layer to form a photosensitive pattern. The method may further include a step patterning the surface of the substrate by using the photosensitive pattern as an etch mask.

The manufacturing method of the semiconductor device may further include a step optimizing the patterns of the photomask by applying one of the methods of detecting focus shift in a lithography process which are described in the above embodiments of the present disclosure. The step of optimizing the patterns of the photomask may include optical proximity correction, pattern size correction, and/or pattern position correction. The step of optimizing the patterns of the photomask may be performed before providing the semiconductor substrate.

The manufacturing method of the semiconductor device may include a step of optimizing a process parameter of an exposure equipment by applying one of the methods of detecting focus shift in a lithography process which are described in the above embodiments of the present disclosure. The step of optimizing the process parameter may include a numerical aperture adjustment in the exposure equipment or exposure dose adjustment of the exposure equipment. The step of optimizing the process parameter of the exposure equipment may be performed before providing the semiconductor substrate.

The foregoing is illustrative of the present inventive concept and is not to be construed as limiting thereof. Although a few embodiments of the present inventive concept have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of the present inventive concept and is not to be construed as limited to the specific embodiments disclosed, and that modifications to the disclosed embodiments, as well as other embodiments, are intended to be included within the scope of the appended claims. The present inventive concept is defined by the following claims, with equivalents of the claims to be included therein.

What is claimed is:

1. A method of manufacturing a semiconductor device, the method comprising:
    providing a semiconductor substrate;
    forming a photosensitive layer on the semiconductor substrate;
    exposing a light pattern on the photosensitive layer using a photomask and an exposure apparatus; and
    developing the photosensitive layer to form photosensitive pattern,
    wherein a pattern of the photomask or a parameter of the exposure apparatus is adjusted using a focus shift detecting method, and the focus shift detecting method comprises;
        generating a first contour band of a mask pattern between a first focus and a second focus;
        generating a second contour band of the mask pattern between the first focus and a third focus; and
        determining whether focus shift of the mask pattern occurs based on an intersection of the first contour band and the second contour band.

2. The method of claim 1, wherein when the intersection is a null set, it is determined that the focus shift of the mask pattern occurs in the lithography process.

3. The method of claim 1, wherein the first focus is a best focus of the exposure apparatus, the second focus is a value obtained by subtracting a predetermined focus deviation from the first focus, and the third focus is a value obtained by adding the predetermined focus deviation to the first focus.

4. The method of claim 3, wherein the focus deviation is twice the focus shift amount to be detected.

5. The method of claim 1, wherein the generating of a first contour band, includes:
    generating a first contour of the mask pattern at the first focus;
    generating a second contour of the mask pattern at the second focus; and performing an XOR operation on the first contour and the second contour.

6. The method of claim 5, wherein in the generating of a first contour, a shape of the mask pattern to be transferred onto the photosensitive layer is simulated with an optical model.

7. The method of claim 1, wherein the adjustment of the pattern of the photomask or the parameter of the exposure apparatus comprises at least one of an optical proximity correction, a pattern size correction, a pattern position correction, an exposure dose correction, and a numerical aperture adjustment.

8. The method of claim 1, wherein the pattern of the photomask or the parameter of the exposure apparatus is adjusted before providing the semiconductor substrate to the exposure apparatus.

* * * * *